(12) United States Patent
Chiu et al.

(10) Patent No.: US 10,998,861 B2
(45) Date of Patent: May 4, 2021

(54) TEMPERATURE ADAPTIVE AUDIO AMPLIFIER DEVICE AND CONTROL METHOD THEREOF

(71) Applicant: REALTEK SEMICONDUCTOR CORP., Hsinchu (TW)

(72) Inventors: Shu-Yeh Chiu, Hsinchu (TW); Yi-Jhong Wu, Kaohsiung (TW); Chung-Hui Weng, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 39 days.

(21) Appl. No.: 16/515,404

(22) Filed: Jul. 18, 2019

(65) Prior Publication Data
US 2020/0028474 A1 Jan. 23, 2020

(30) Foreign Application Priority Data

Jul. 20, 2018 (TW) .................................. 107125136

(51) Int. Cl.
*H03F 1/30* (2006.01)
*H03G 3/30* (2006.01)
*H03F 3/183* (2006.01)

(52) U.S. Cl.
CPC ............... *H03F 1/30* (2013.01); *H03F 3/183* (2013.01); *H03G 3/3005* (2013.01); *H03F 2200/03* (2013.01); *H03F 2200/447* (2013.01); *H03F 2200/468* (2013.01); *H03G 2201/103* (2013.01); *H03G 2201/708* (2013.01)

(58) Field of Classification Search
CPC combination set(s) only.
See application file for complete search history.

(56) References Cited

U.S. PATENT DOCUMENTS 4,742,312 A    5/1988  Osburn et al.
5,107,389 A *  4/1992  Botti ......................... H03F 1/52
                                                    330/207 R
(Continued)

FOREIGN PATENT DOCUMENTS

CN    105549946 A    5/2016
TW    201536066 A    9/2015

*Primary Examiner* — Duc Nguyen
*Assistant Examiner* — Assad Mohammed
(74) *Attorney, Agent, or Firm* — Li & Cai Intellectual Property (USA) Office

(57) ABSTRACT

A temperature adaptive audio amplifier device includes a digital analog convertor, a gain controller, an amplifier, a temperature sensor and a decision circuit. The digital analog convertor transforms a digital audio signal into an analog convertor. The gain controller includes a gain value and is configured to perform gain processing on the analog audio signal and generate a gained analog audio signal. The amplifier is configured to amplify the gained analog audio signal and generates an amplified analog audio signal. The temperature sensor generates a temperature detect signal according to a junction temperature of the amplifier. The decision circuit receives the temperature detect signal and generates an adaptive gain adjustment signal to the gain controller. The adaptive gain adjustment signal is used to adjust the junction temperature of the amplifier to be within an upper temperature threshold and a lower temperature threshold.

18 Claims, 9 Drawing Sheets

(56) References Cited

U.S. PATENT DOCUMENTS

| | | | | |
|---|---|---|---|---|
| 5,777,568 A | * | 7/1998 | Inoue | H03M 1/129 |
| | | | | 341/138 |
| 2004/0184627 A1 | | 9/2004 | Kost et al. | |
| 2011/0228945 A1 | | 9/2011 | Mihelich et al. | |
| 2012/0321104 A1 | * | 12/2012 | Kemmerer | H03G 3/3021 |
| | | | | 381/107 |
| 2015/0008962 A1 | * | 1/2015 | Blyth | H03F 1/0227 |
| | | | | 327/59 |
| 2015/0263684 A1 | * | 9/2015 | Tu | H04R 3/007 |
| | | | | 381/120 |
| 2017/0150259 A1 | * | 5/2017 | Gautama | H03G 7/002 |

\* cited by examiner

TEMPERATURE ADAPTIVE AUDIO AMPLIFIER DEVICE AND CONTROL METHOD THEREOF

CROSS-REFERENCE TO RELATED PATENT APPLICATION

This application claims the benefit of priority to Taiwan Patent Application No. 107125136, filed on Jul. 20, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an audio amplifier device, and more particularly to a temperature adaptive audio amplifier device and a control method thereof.

BACKGROUND OF THE DISCLOSURE

In the semiconductor manufacturing process, an ambient temperature and a heat loss temperature of the chip are very important. When the heat loss temperature is too high, it can lead to a burning of the chip or a short-circuit phenomenon. In related art, there are several ways to reduce the ambient temperature and the heat loss temperature of the chip. To change the way of forming the thermal resistance of the chip, manufacturing costs may be increased, or the package volume may be increased. To reduce the ambient temperature, the heat dissipation mechanism would need to be changed, such as increasing the number of heatsinks or changing the assembly position of the internal components.

SUMMARY OF THE DISCLOSURE

In response to the above-referenced technical inadequacies, the present disclosure provides a temperature adaptive audio amplifier device and a control method thereof.

In one aspect, a device adapted for coupling to a speaker comprising: a digital and analog converter configured for receiving and converting a digital audio to an analog audio signal; a gain controller coupled to the digital and analog converter and configured to perform gain processing on the analog audio signal and generate a gained analog audio signal; an amplifier coupled to the gain controller and configured to amplify the gained analog audio signal and generate an amplified analog audio signal; a temperature sensor coupled to the amplifier and configured for generating a temperature detection signal based on a junction temperature of the amplifier; and a decision circuit coupled between the temperature sensor and the gain controller and configured for receiving the temperature detection signal transmitted by the temperature sensor and for generating a corresponding gain adjustment signal to the gain controller; wherein the decision circuit configures the gain adjustment signal for adjusting the junction temperature of the amplifier to be below an upper temperature threshold.

In one aspect, a control method for using in a temperature adaptive audio amplifier device with an analog/digital converter, a gain controller, an amplifier, a temperature sensor, a decision circuit, a DC converter and a speaker, the control method comprising: converting a digital audio signal to an analog audio signal by the digital/analog converter; generating a gained analog audio signal by the gain controller; generating an amplified analog audio signal by the amplifier; generating a temperature detection signal by the temperature sensor; and generating a gain adjustment signal to the gain controller by the decision circuit; wherein the adaptive gain adjustment signal generated by the decision circuit is used to adjust the junction temperature of the amplifier to be within an upper temperature threshold and a lower temperature threshold through the gain controller.

In one aspect, the present disclosure provides a temperature adaptive audio amplifier device, including: a digital/analog converter for receiving a digital audio signal, the digital/analog converter converting the digital audio signal to an analog audio signal; a gain controller coupled to the digital/analog converter, the gain controller having a gain value and being configured to gain the analog audio signal and generate a gained analog audio signal; an amplifier coupled to the gain controller and being configured to amplify the gained analog audio signal and generate an amplified analog audio signal, the amplifier being further coupled to a speaker, which is used to play the amplified analog audio signal; a temperature sensor coupled to the amplifier, the temperature sensor generating a temperature detection signal based on a junction temperature of the amplifier; a decision circuit coupled between the temperature sensor and the gain controller, the decision circuit receiving the temperature detection signal transmitted by the temperature sensor and generating a corresponding gain adjustment signal to the gain controller.

Specifically, the adaptive gain adjustment signal generated by the decision circuit is used to adjust the junction temperature of the amplifier to be within an upper temperature threshold and a lower temperature threshold.

In one aspect, the present disclosure provides a control method for using in a temperature adaptive audio amplifier device with an analog/digital converter, a gain controller, an amplifier, a temperature sensor, a decision circuit, a DC converter and a speaker, the control method including: converting a digital audio signal to an analog audio signal by the digital/analog converter; generating a gained analog audio signal by the gain controller; generating an amplified analog audio signal by the amplifier; generating a temperature detection signal by the temperature sensor; and generating a gain adjustment signal to the gain controller by the decision circuit.

Specifically, the adaptive gain adjustment signal generated by the decision circuit is used to adjust the junction temperature of the amplifier to be within an upper temperature threshold and a lower temperature threshold through the gain controller.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
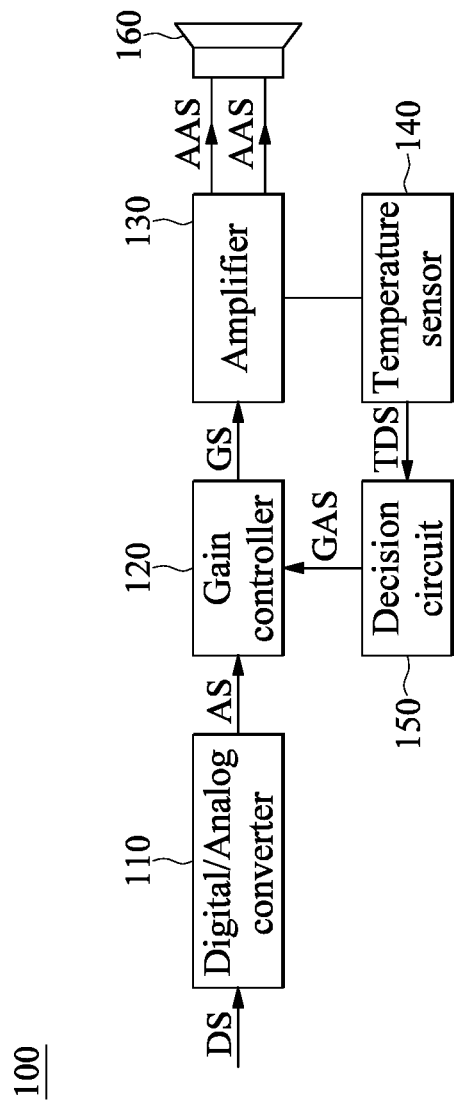
FIG. 1 is a block diagram showing a temperature adaptive audio amplifier device according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram showing a temperature adaptive audio amplifier device according to an embodiment of the present disclosure. An audio amplifier device 100 includes a digital/analog converter 110, a gain controller 120, an amplifier 130, a temperature sensor 140 and a decision circuit 150. The digital/analog converter 110 is used to receive a digital audio signal DS, and the digital/analog converter 110 converts a digital audio signal DS to an analog audio signal AS, wherein the digital/analog converter 110 can receive the digital audio signal DS either by wired or wireless manners. The gain controller 120 is coupled to the digital/analog converter 110, and the gain controller 120 has a gain value and is configured to perform a gain processing on the analog audio signal AS and generate a gained analog audio signal GS. The amplifier 130, coupled to the gain controller 120, amplifies the gained analog audio signal GS, and generates an amplified analog audio signal AAS. The temperature sensor 140, coupled to the amplifier 130, generates a temperature detection signal TDS according to a junction temperature of the amplifier 130. The decision circuit 150, coupled between the temperature sensor 140 and the gain controller 120, receives the temperature detection signal TDS transmitted by the temperature sensor 140, and generates a corresponding adaptive gain adjustment signal GAS to the gain controller 120 according to the temperature detection signal TDS. For example, when a temperature value of the temperature detection signal TDS is too high, the adaptive gain adjustment signal GAS is used to reduce the gain value; when a temperature value of the temperature detection signal TDS is no longer that high, the adaptive gain adjustment signal GAS is used to increase the gain value.

The adaptive gain adjustment signal GAS generated by the decision circuit 150 is used to adjust the junction temperature of the amplifier 130 to be within an upper temperature threshold and a lower temperature threshold through the gain controller 120. The amplifier 130 is further adapted for coupling to a speaker 160, which is used to play the amplified analog audio signal AAS. For example, the digital/analog converter 110, the gain controller 120, the amplifier 130, the temperature sensor 140 and the decision circuit 150 can reside on the same chip. The temperature sensor 140 is used for sensing a junction temperature of the amplifier 130. When the junction temperature is higher than the upper temperature threshold, the junction temperature of the amplifier 130 can be reduced by reducing the gain value. When the junction temperature falls to an acceptable or a predetermined operating temperature, the gain value is increased or restored. Therefore, the junction temperature of the amplifier 130 can be controlled within the upper temperature threshold and the lower temperature threshold (acceptable or a predetermined operating temperature). Further, the temperature sensor 140 may also be disposed inside the amplifier 130, so that the junction temperature of the amplifier 130 can be more accurately measured.

Figure 2:
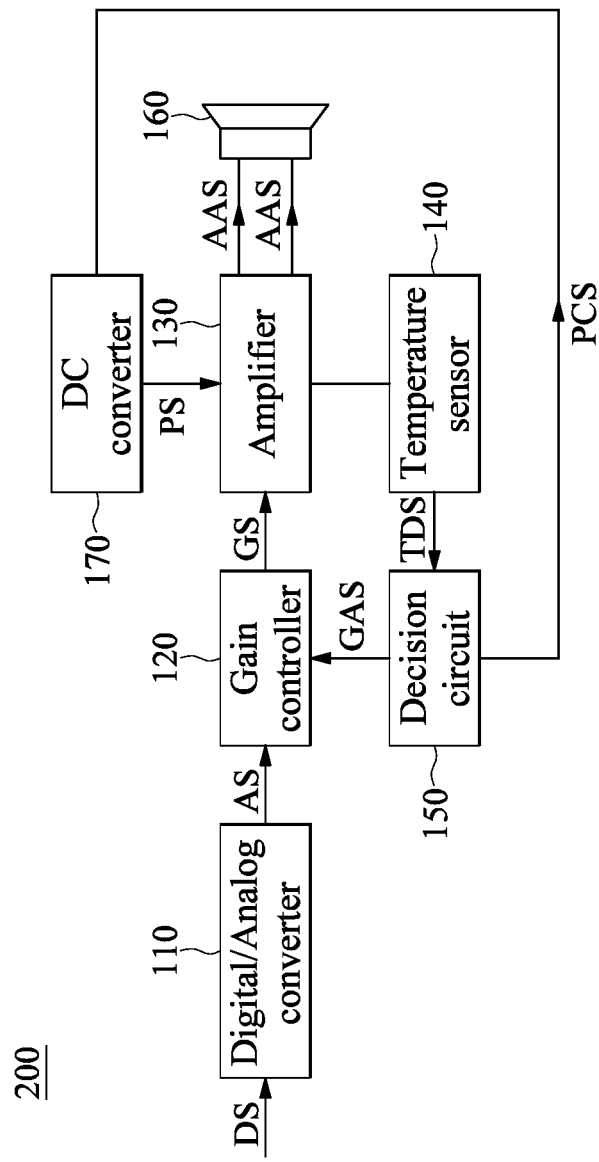
FIG. 2 is another block diagram showing a temperature adaptive audio amplifier device according to an embodiment of the present disclosure.

Reference is made to FIG. 2, which is another block diagram showing a temperature adaptive audio amplifier device according to an embodiment of the present disclosure. An audio amplifier device 200 includes a digital/analog converter 110, a gain controller 120, an amplifier 130, a temperature sensor 140, a decision circuit 150, a speaker 160 and a DC converter 170. In which, detailed descriptions for the digital/analog converter 110, the gain controller 120, the amplifier 130, the temperature sensor 140, the decision circuit 150 and the speaker 160 are provided in the recitation of the embodiment of FIG. 1, and will not be repeated herein.

The DC converter 170 is coupled to the amplifier 130 and receives the voltage source. The DC converter 170 provides a power signal PS to the amplifier 130 that is used to supply power to the amplifier 130. Further, the DC converter 170 is coupled to the decision circuit 150, which generates a power control signal PCS according to a temperature detection signal TDS and then transmits the power control signal PCS to the DC converter 170. The power control signal PCS is used to control voltage levels of the power signal PS. For example, when the junction temperature of the amplifier 130 is below a lower temperature threshold, the power control signal PCS transmitted by the decision circuit 150 increases voltage levels of the power signal PS, by which a high voltage level can enhance the junction temperature of the amplifier 130. When the junction temperature of the amplifier 130 is above an upper temperature threshold, the power control signal PCS transmitted by the decision circuit 150 reduces voltage levels of the power signal PS, by which a low voltage level can reduce the junction temperature of the amplifier 130. In one embodiment, the upper temperature threshold can be 125 degrees, while the lower temperature threshold can be 70 degrees, and the present invention is not limited in this respect.

Figure 3:
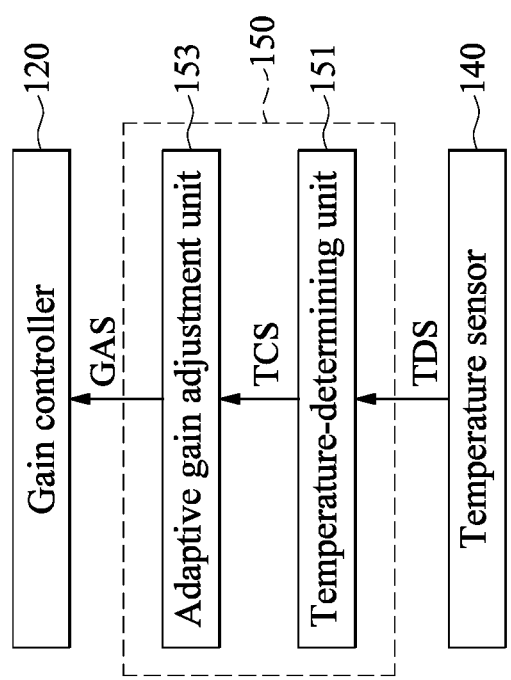
FIG. 3 is a block diagram showing a decision circuit according to an embodiment of the present disclosure.

Reference is made to FIG. 3, which is a block diagram showing the decision circuit according to an embodiment of the present disclosure. The decision circuit 150 includes a temperature-determining unit 151 and an adaptive gain adjustment unit 153. The temperature-determining unit 151 is coupled to the temperature sensor 140 and receives a temperature detection signal TDS transmitted by a temperature sensor 140. The temperature-determining unit 151 produces a temperature comparison signal TCS according to a temperature detection signal, an upper temperature threshold and a lower temperature threshold. The upper temperature threshold and the lower temperature threshold disclosed herein can be customized by the user or be set by the manufacturer, and the present invention is not limited in this respect. The adaptive gain adjustment unit 153 is coupled between the temperature-determining unit 151 and the gain controller 120, and receives the temperature comparison signal TCS transmitted by the temperature-determining unit 151. The adaptive gain adjustment unit 153 generates the adaptive gain adjustment signal GAS to the gain controller 120 according to the temperature comparison signal TCS. The adaptive gain adjustment signal GAS is used to adjust the gain value. Additionally, adjustments to the gain value can include maintaining the gain value, increasing the gain value, and reducing the gain value.

Further, when the temperature comparison signal TCS indicates that a temperature value of the temperature detection signal TDS is between the upper temperature threshold and the lower temperature threshold, the adaptive gain adjustment signal GAS transmitted by the gain adjustment unit 153 is used to maintain the gain value, so as to maintain a junction temperature of the amplifier 130. When the temperature comparison signal TCS indicates that a temperature value of the temperature detection signal TDS is higher than the upper temperature threshold, the junction temperature of the amplifier 130 may be reduced by reducing the gain value. When the junction temperature falls to an acceptable or a predetermined operating temperature, the adaptive gain adjustment signal GAS transmitted by the gain adjustment unit 153 is used to restore the reduced gain value. When the temperature comparison signal TCS indicates that a temperature value of the temperature detection signal TDS is above the upper temperature threshold, the adaptive gain adjustment signal GAS transmitted by the gain adjustment unit 153 is used to reduce the gain value, so as to decrease the junction temperature of the amplifier 130.

Figure 4A:
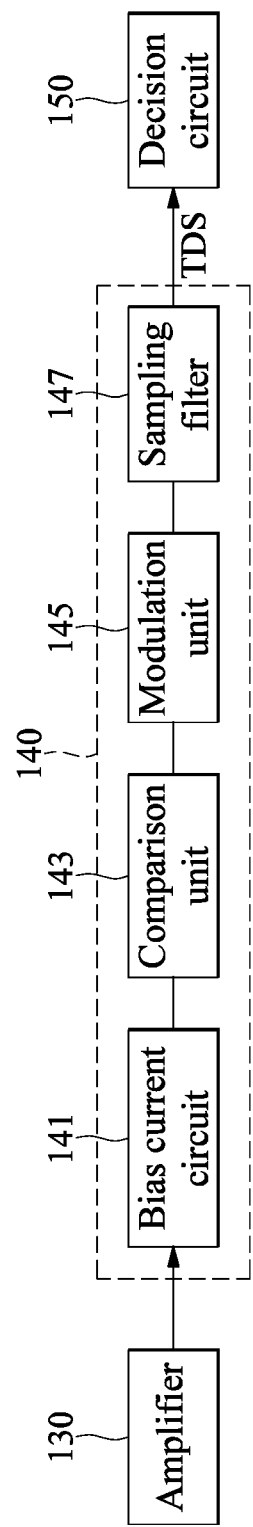
FIG. 4A is a block diagram showing a temperature sensor according to an embodiment of the present disclosure.
Figure 4B:
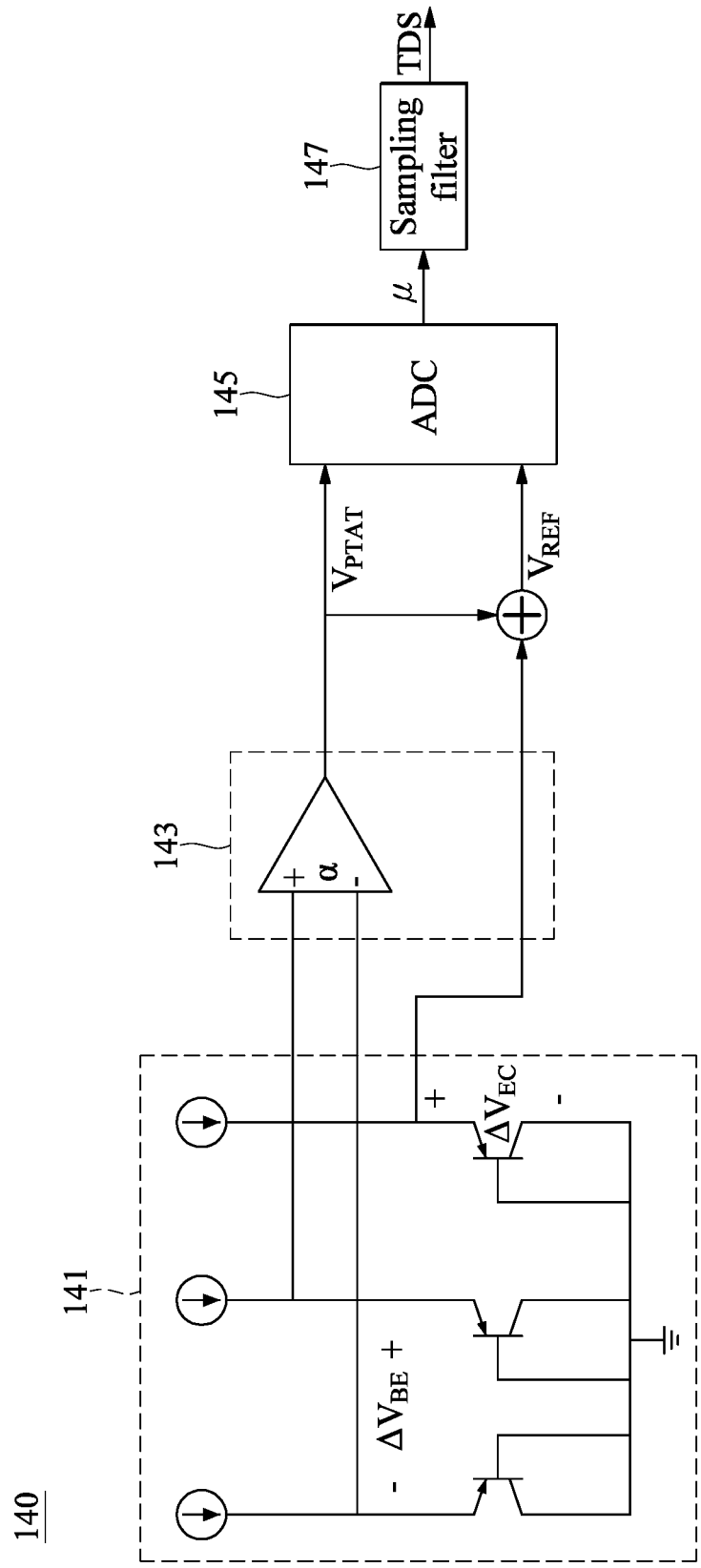
FIG. 4B is a circuit diagram showing the temperature sensor according to an embodiment of the present disclosure.

Reference is made to FIGS. 4A and 4B. FIG. 4A illustrates a block diagram showing a temperature sensor according to an embodiment of the present disclosure, while FIG. 4B illustrates a circuit diagram showing the temperature sensor according to an embodiment of the present disclosure. In FIG. 4A, the temperature sensor 140 includes a bias current circuit 141, a comparison unit 143, a variable unit 145 and a sampling filter 147. The bias current circuit 141 has a plurality of transistors, and each transistor receives a different bias current. In this embodiment, each transistor is a PNP-type bipolar transistor.

The comparison unit 143 is coupled to the bias current circuit 141 and has at least a comparator and adder. The comparator has a first parameter a, and produces a first voltage VPTAT according to the first parameter a and a pressure difference of the transistor. The adder produces a second voltage VREF according to the first voltage VPTAT and a cross-voltage of the transistor, in which the second voltage VREF does not vary along with the temperature.

The modulation unit 145 is coupled to the comparison unit 143 and produces a second parameter μ according to the ratio of the first voltage VPTAT to the second voltage VREF. In this embodiment, the modulation unit 145 can be implemented by use of an analog/digital converter. The sampling filter 147, coupled to the modulation unit 145, receives the second parameter μ transmitted by the modulation unit 145, and filters the second parameter μ and produces a temperature detection signal TDS. For example, the sampling filter 147 can be a band-pass filter. The following formula can be referred to for the description above:

$$\mu = \frac{\alpha \cdot \Delta V_{BE}}{V_{BE} + \alpha \cdot \Delta V_{BE}} = \frac{\alpha \cdot \Delta V_{BE}}{V_{REF}} = \frac{V_{PTAT}}{V_{RE}}$$

Figure 5:
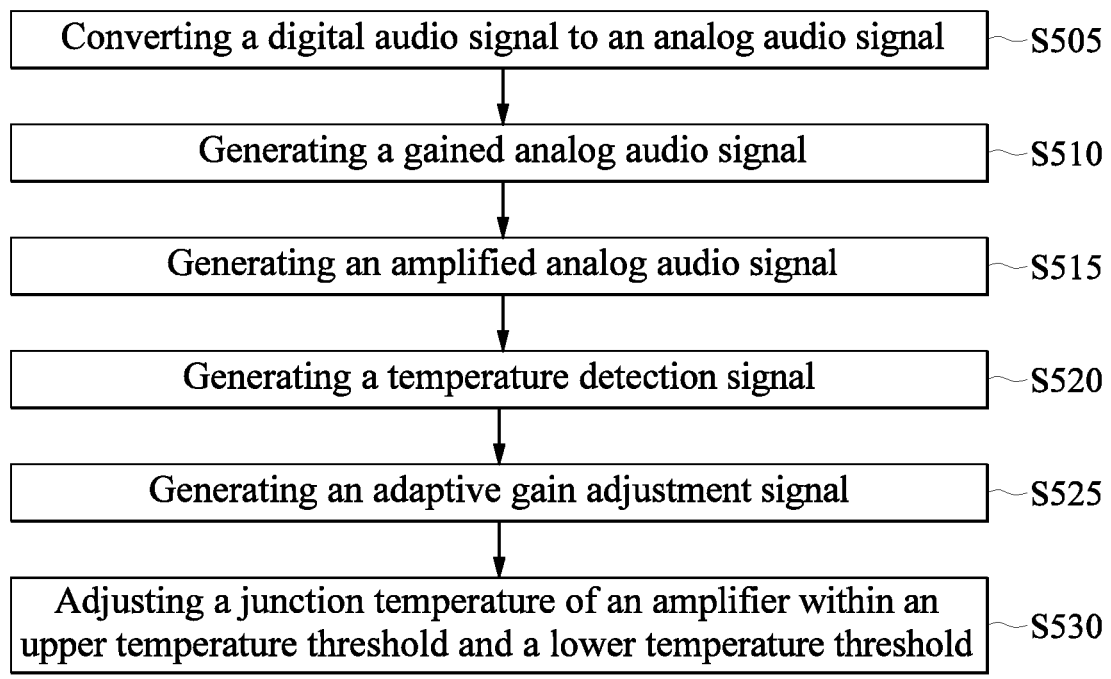
FIG. 5 is a flowchart showing a control method according to an embodiment of the present disclosure.

Reference is made to FIGS. 2 and 5. FIG. 5 illustrates a flowchart showing a control method according to an embodiment of the present disclosure. In step S505, a digital audio signal is converted to an analog audio signal DS by the digital/analog converter 110. In step S510, a gained analog audio signal GS is generated by a gain controller 120. In step S515, an amplified analog audio signal AAS is generated by an amplifier 130. In step S520, the temperature detection signal TDS is generated by the temperature sensor 140. In step S525, a decision circuit 150 generates an adaptive gain adjustment signal GAS to the gain controller 120. In step S530, the adaptive gain adjustment signal GAS generated by the decision circuit 150 is used to adjust a junction temperature of an amplifier 130 to be within an upper temperature threshold and a lower temperature threshold through the gain controller 120.

Figure 6:
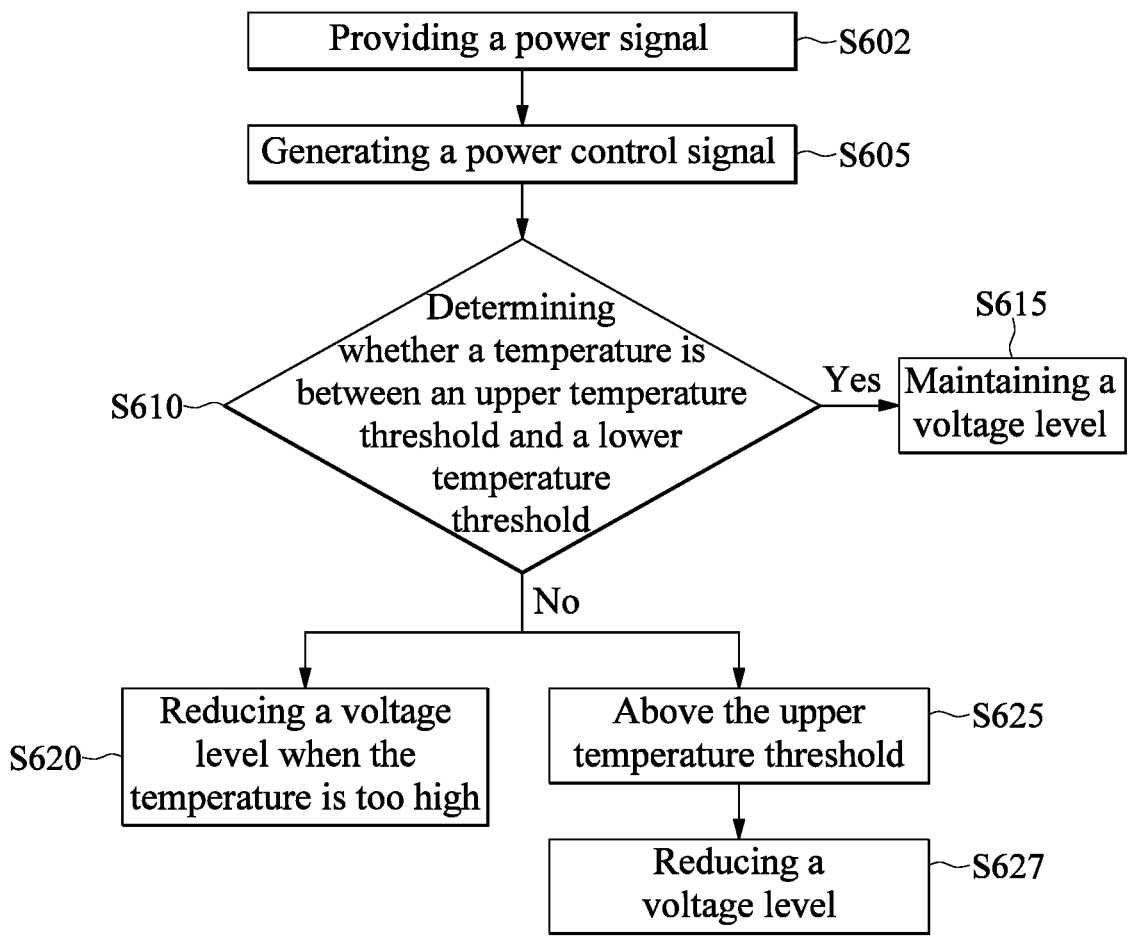
FIG. 6 is another flowchart showing a control method according to an embodiment of the present disclosure.

Reference is made to FIGS. 2 and 6. FIG. 6 illustrates another flowchart showing a control method according to an embodiment of the present disclosure. In step S602, a DC converter 170 receives the voltage source and provides a power signal PS to an amplifier 130, the power signal PS being used to supply power to the amplifier 130. In step S605, a decision circuit 150 generates a power control signal PCS and transmits the power control signal PCS to the DC converter 170. The power control signal PCS is used to control voltage levels of the power signal PS. In step S610, the decision circuit 150 determines whether a junction temperature of the amplifier 130 is between an upper temperature threshold and a lower temperature threshold. If so, the method proceeds to step S615. If not, the method proceeds to step S620 and step S625. In step S615, the power control signal PCS is used to maintain a voltage level of the power signal PS. In step S620, when the decision circuit 150 determines the junction temperature is higher than the upper temperature threshold, the junction temperature of the amplifier 130 may be reduced by reducing a voltage level of the power signal PS. When the junction temperature falls to an acceptable or predetermined operating temperature, the voltage level of the power signal PS can be restored. In step S625, the decision circuit 150 determines that the junction temperature of the amplifier 130 is above the upper temperature value. In step S627, the power control signal PCS is used to reduce the voltage levels of the power signal PS.

Figure 7:
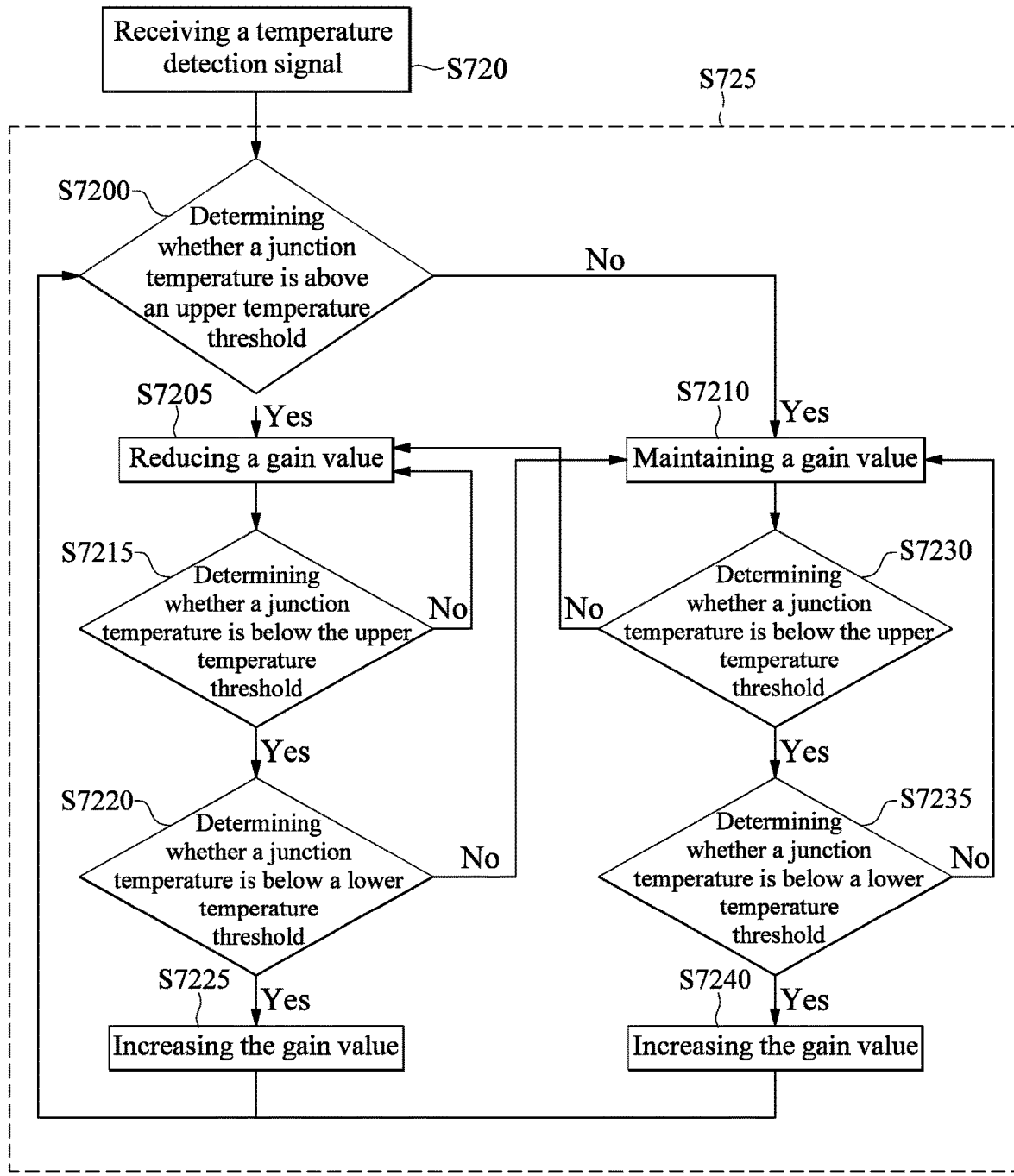
FIG. 7 is another flowchart showing a control method according to an embodiment of the present disclosure.

Reference is made to FIGS. 2 and 7. FIG. 7 illustrates another flowchart showing a control method according to an embodiment of the present disclosure. In step S720, a temperature of the temperature-determining unit 151 receives a temperature detection signal TDS transmitted by a temperature sensor 140. The temperature-determining unit 151 produces a temperature comparison signal TCS according to the temperature detection signal TDS, an upper temperature threshold and a lower temperature threshold. In step S725, an adaptive gain adjustment unit 153 generates an adaptive gain adjustment signal GAS to a gain controller 120 according to the temperature comparison signal TCS, and the adaptive gain adjustment signal GAS is used for adjusting the gain value.

The following is a detailed illustration of step S725. In step S7200, the decision circuit 150 determines whether a junction temperature of an amplifier 130 is above the upper temperature threshold. If so, the method proceeds to step S7205. If not, the method proceeds to step S7210. In step S7205, the adaptive gain adjustment signal GAS transmitted by the decision circuit 150 is used to reduce the gain value. In step S7210, the adaptive gain adjustment signal GAS transmitted by the decision circuit 150 gas is used to maintain the gain value. In step S7200, the decision circuit 150 determines whether a junction temperature of the amplifier 130 is below the upper temperature threshold is done. If so, the method proceeds to step S7220. If not, the method returns to step S7205. In step S7220, the decision circuit 150 determines whether a junction temperature of the amplifier 130 is below the lower temperature threshold. If so, the method proceeds to step S7225. If not, the method returns to step S7210. In step S7225, the adaptive gain adjustment signal GAS transmitted by the decision circuit 150 is used to increase the gain value. In step S7230, the decision circuit 150 determines whether a junction temperature of the amplifier 130 is below the lower temperature threshold. If so, the method proceeds to step S7235. If not, the method returns to step S7205. In step S7235, the decision circuit 150 determines whether a junction temperature of the amplifier 130 is below the lower temperature threshold. If so, the method proceeds to step S7240. If not, the method returns to step S7210. In step S7240, the adaptive gain adjustment signal GAS transmitted by the decision circuit 150 is used to increase the gain value.

Figure 8:
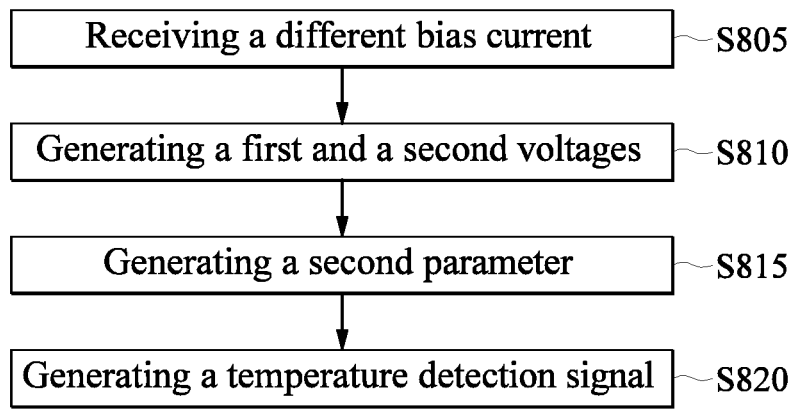
FIG. 8 is another flowchart showing a control method according to an embodiment of the present disclosure.

Reference is made to FIGS. 4B and 8. FIG. 8 illustrates another flowchart showing a control method according to an embodiment of the present disclosure. In step S805, each transistor receives a different bias current respectively. In step S810, a comparator generates a first voltage VPTAT according to a first parameter a and a voltage difference of a transistor, and an adder generates a second voltage VREF according to the first voltage VPTAT and a cross voltage of a transistor. In step S815, a second parameter μ is generated according to the ratio of the first voltage VPTAT to the second voltage VREF by a modulation unit 145. In step S820, the second parameter μ is filtered by a sampling filter 147 and a temperature detection signal TDS is generated, wherein each transistor is a PNP-type bipolar transistor.

In conclusion, the present disclosure provides a temperature adaptive audio amplifier device, in which the temperature sensor detects the junction temperature of the amplifier and the decision circuit determines whether the junction temperature of the amplifier is within the upper temperature threshold and the lower temperature threshold. When the junction temperature of the amplifier is not within the upper temperature threshold and the lower temperature threshold, the decision circuit adjusts the gain value and/or the power signal so that the amplifier and the junction temperature thereof can return to normal operating temperatures. This can increase the service life of the temperature adaptive audio amplifier device and the speaker. In addition, only a few electronic components are required to additionally provide a decision circuit and a temperature sensor, thereby saving costs and achieving a rapid temperature decreasing/increasing effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A device adapted for coupling to a speaker comprising:
a digital and analog converter configured for receiving and converting a digital audio to an analog audio signal;
a gain controller coupled to the digital and analog converter and configured to perform gain processing on the analog audio signal and generate a gained analog audio signal;
an amplifier coupled to the gain controller and configured to amplify the gained analog audio signal and generate an amplified analog audio signal;
a temperature sensor coupled to the amplifier and configured for generating a temperature detection signal based on a junction temperature of the amplifier; and
a decision circuit coupled between the temperature sensor and the gain controller and configured for receiving the temperature detection signal transmitted by the temperature sensor and for generating a corresponding gain adjustment signal to the gain controller;
wherein the decision circuit configures the gain adjustment signal for adjusting the junction temperature of the amplifier to be below an upper temperature threshold;
wherein the temperature sensor includes:
a bias current circuit including a plurality of transistors, each of which receives a different bias current;
a comparison unit that is coupled to the bias current circuit and that includes at least a comparator and an adder, the comparator generating a first voltage according to a first parameter and a voltage difference of the transistor, the adder generating a second voltage according to the first parameter and the voltage difference of the transistor;
a modulation unit coupled to the comparator and generating a second parameter based on a ratio of the first voltage to the second voltage; and
a sampling filter coupled to the modulation unit, the sampling filter receiving the second parameter transmitted by the modulation unit, filtering the second parameter, and generating the temperature detection signal.

2. The device as claimed in claim 1, further comprising: a DC converter that is coupled to the amplifier and that receives a voltage source and provides the amplifier with a power signal, the power signal being used to supply power to the amplifier.

3. The device as claimed in claim 2, wherein the DC converter is coupled to the decision circuit, and the decision circuit generates a power control signal according to the temperature detection signal and transmits the power control signal to the DC converter, and the power control signal is used to control voltage levels of the power signal.

4. The device as claimed in claim 3, wherein when the junction temperature of the amplifier is below the lower temperature threshold, the power control signal is used to increase voltage levels of the power signal.

5. The device as claimed in claim 3, wherein when the junction temperature of the amplifier is above the upper temperature threshold, the power control signal is used to lower voltage levels of the power signal.

6. The device as claimed in claim 1, wherein the decision circuit further includes:
a temperature-determining unit coupled to the temperature sensor, the temperature-determining unit receiving the temperature detection signal transmitted by the temperature sensor, and generating a temperature comparison signal based on the temperature detection signal, the upper temperature threshold and the lower temperature threshold; and
an adaptive gain adjustment unit coupled between the temperature determining unit and the gain controller, the adaptive gain adjustment unit receiving the temperature comparison signal transmitted by the temperature determining unit, and generating the adaptive gain adjustment signal to the gain controller according to the temperature comparison signal, the adaptive gain adjustment signal being used to adjust the gain value.

7. The device as claimed in claim 6, wherein when the temperature comparison signal indicates that the temperature detection signal is between the upper temperature threshold and the lower temperature threshold, the adaptive gain adjustment signal transmitted by the adaptive gain adjustment unit is used to maintain the gain value;
wherein when the temperature comparison signal indicates that the temperature detection signal is below the lower temperature threshold, the adaptive gain adjustment signal transmitted by the adaptive gain adjustment unit is used to increase the gain value, wherein when the temperature comparison signal indicates that the temperature detection signal is above the upper temperature threshold, the adaptive gain adjustment signal transmitted by the adaptive gain adjustment unit is used to reduce the gain value.

8. The device as claimed in claim 1, wherein the plurality of transistors are PNP-type bipolar transistors.

9. The device as claimed in claim 1, wherein when the junction temperature is higher than the upper temperature threshold, the junction temperature of the amplifier is reduced by reducing a gain value of the gain controller, and when the junction temperature falls to a predetermined operating temperature, the reduced gain value is restored.

10. A control method for using in a temperature adaptive audio amplifier device with an analog/digital converter, a gain controller, an amplifier, a temperature sensor, a decision circuit, a DC converter and a speaker, the control method comprising:
converting a digital audio signal to an analog audio signal by the digital/analog converter;
generating a gained analog audio signal by the gain controller;
generating an amplified analog audio signal by the amplifier;
generating a temperature detection signal by the temperature sensor; and
generating a gain adjustment signal to the gain controller by the decision circuit;
wherein the adaptive gain adjustment signal generated by the decision circuit is used to adjust the junction temperature of the amplifier to be within an upper temperature threshold and a lower temperature threshold through the gain controller;
wherein the temperature sensor includes:
a comparison unit, a modulation unit, a sampling filter and a bias current circuit, the bias current circuit having a plurality of transistors and the comparison unit having a comparator and an adder, the method further comprising:
receiving a different bias current by each of the plurality of transistors;
generating, by the comparator, a first voltage according to a first parameter and a voltage difference of the transistor, and generating, by the adder, a second voltage according to the first parameter and the voltage difference of the transistor;
generating, by the modulation unit, a second parameter based on a ratio of the first voltage to the second voltage; and
filtering, by the sampling filter, the second parameter, and generating the temperature detection signal by the sampling filter.

11. The method as claimed in claim 10, further comprising: the DC converter receiving a voltage source and providing the amplifier with a power signal, the power signal being used to supply power to the amplifier.

12. The method as claimed in claim 11, wherein the decision circuit generates a power control signal according to the temperature detection signal and transmits the power control signal to the DC converter, and the power control signal is used to control voltage levels of the power signal.

13. The method as claimed in claim 12, wherein when the junction temperature of the amplifier is below the lower temperature threshold, the power control signal is used to increase voltage levels of the power signal.

14. The method as claimed in claim 12, wherein when the junction temperature of the amplifier is above the upper temperature threshold, the power control signal is used to lower voltage levels of the power signal.

15. The method as claimed in claim 10, wherein the decision circuit further includes:
a temperature-determining unit and an adaptive gain adjustment unit, the method further comprising:
receiving, by the temperature-determining unit, the temperature detection signal transmitted by the temperature sensor, and generating, by the temperature-determining unit, a temperature comparison signal based on the temperature detection signal, the upper temperature threshold and the lower temperature threshold; and
generating, by the adaptive gain adjustment unit, the adaptive gain adjustment signal to the gain controller according to the temperature comparison signal, the adaptive gain adjustment signal being used to adjust the gain value.

16. The method as claimed in claim 15, wherein:
when the temperature comparison signal indicates that the temperature detection signal is between the upper temperature threshold and the lower temperature threshold, the adaptive gain adjustment signal transmitted by the adaptive gain adjustment unit is used to maintain the gain value;
when the temperature comparison signal indicates that the temperature detection signal is below the lower temperature threshold, the adaptive gain adjustment signal transmitted by the adaptive gain adjustment unit is used to increase the gain value, and
when the temperature comparison signal indicates that the temperature detection signal is above the upper temperature threshold, the adaptive gain adjustment signal transmitted by the adaptive gain adjustment unit is used to reduce the gain value.

17. The method as claimed in claim 10, wherein the plurality of transistors are PNP-type bipolar transistors.

18. The method as claimed in claim 10, wherein when the junction temperature is higher than the upper temperature threshold, the junction temperature of the amplifier is reduced by reducing a gain value of the gain controller, and when the junction temperature falls to a predetermined operating temperature, the reduced gain value is restored.

* * * * *